(12) United States Patent
Yu et al.

(10) Patent No.: US 7,471,588 B2
(45) Date of Patent: Dec. 30, 2008

(54) DUAL PORT RANDOM-ACCESS-MEMORY CIRCUITRY

(75) Inventors: Haiming Yu, San Jose, CA (US); Tony K. Ngai, San Jose, CA (US); Kok Heng Choe, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/506,254

(22) Filed: Aug. 18, 2006

(65) Prior Publication Data

US 2007/0258313 A1 Nov. 8, 2007

Related U.S. Application Data

(60) Provisional application No. 60/797,884, filed on May 5, 2006.

(51) Int. Cl.
*G11C 11/00* (2006.01)

(52) U.S. Cl. .................................. 365/230.05; 365/226

(58) Field of Classification Search ............ 365/230.05, 365/226
See application file for complete search history.

(56) References Cited

U.S. PATENT DOCUMENTS

| | | | |
|---|---|---|---|
| 4,802,128 A | 1/1989 | Watanabe et al. | |
| 4,899,311 A | 2/1990 | Petschauer et al. | |
| 5,191,553 A | 3/1993 | Mizoguchi et al. | |
| 5,475,637 A | 12/1995 | Fu et al. | |
| 5,508,961 A | 4/1996 | Han | |
| 5,828,603 A | 10/1998 | Pathak | |
| 6,373,764 B2 | 4/2002 | Fujioka | |
| 2006/0028860 A1* | 2/2006 | Lien et al. | ................... 365/154 |
| 2006/0039180 A1* | 2/2006 | Kawasumi | ................... 365/154 |
| 2007/0115739 A1* | 5/2007 | Huang | ........................ 365/203 |
| 2007/0133327 A1* | 6/2007 | Huang | ........................ 365/207 |

OTHER PUBLICATIONS

"Circuit Techniques for High-Speed and Low-Power Multi-Port SRAMS". Muhammad M. Khellah and M. I. Elmasry. ASIC Conference 1998. Sep. 13, 1998.

* cited by examiner

*Primary Examiner*—Michael T Tran
(74) *Attorney, Agent, or Firm*—Treyz Law Group; G. Victor Treyz; David C. Kellogg

(57) ABSTRACT

Dual port memory array circuitry is provided that includes bit line voltage clamping circuitry. The clamping circuitry contains control transistors that are used to enable and disable the clamping circuitry. The clamping circuitry also contains voltage regulator transistors and feedback paths. When a write operation is performed on one port of the dual port memory array while a read operation is being performed on the other port of the dual port memory array, the bit line voltage clamping circuitry prevents the voltages on the read port bit lines from dropping too low. This allows the write operation to be performed rapidly, even if the memory cell being written to has been adversely affected by variations due to process, voltage, and temperature.

13 Claims, 9 Drawing Sheets

DUAL PORT RANDOM-ACCESS-MEMORY CIRCUITRY

This application claims the benefit of provisional patent application No. 60/797,884, filed May 5, 2006, which is hereby incorporated by reference herein in its entirety.

BACKGROUND

This invention relates to dual port random-access-memory circuits, and more particularly, to dual port random-access memory circuits with clamping circuitry to limit maximum bit line voltage swings in read bit lines during concurrent read and write operations.

Dual port memory arrays are used in integrated circuits such as integrated circuit memories and programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices generally contain arrays of random-access memory (RAM). These memory arrays, which are sometimes referred to as embedded array blocks (EABs) are used to handle the storage needs of the circuitry on the device. During normal operation of a programmable logic device, the hardwired and programmable circuitry of the device performs read and write operations on the memory of the blocks. Memory arrays on a programmable logic device typically range in size from a few kilobits to about a megabit or more.

Integrated circuits such as programmable logic devices are often configured to implement memory-based circuits such as clock conversion first-in-first-out (FIFO) circuits. In a typical scenario, data is written into a FIFO using one clock signal and is read out of the FIFO using another clock signal.

Circuits such as FIFO circuits on programmable logic devices are implemented using dual port random-access-memory arrays. Dual port memory arrays are also used in application specific integrated circuits and stand-alone memory chips.

Dual port memory arrays have two independent ports, which can be used for read and write operations. On programmable logic device integrated circuits with dual port memory arrays, programmable logic circuitry and a dual port memory array can be configured to implement a FIFO. One of the dual port memory array's ports is used for write operations, while the other of the dual port memory array's ports is used for read operations.

Dual port memory arrays contain rows and columns of memory cells. Dual port memory array cells are accessed using word lines and bit lines. Because there are two ports associated with each cell, there are two sets of word lines and two sets of bit lines associated with each memory array.

Normal operation of a dual port memory can be disrupted if a write operation on one port occurs during a read operation on the other port.

One way to avoid this type of overlap between read and write operations involves using a common clock for both ports. When a common clock is used, read and write operations can be performed using distinct clock phases, thereby preventing undesirable overlap. However, certain applications such as clock conversion FIFO circuits involve two independent clocks. If it is desired to implement a FIFO circuit of this type, it is not possible to use a common clock for the two ports of the dual port memory array.

Another way to address the disruptions involved when read and write operations overlap involves extending the write clock period. When a longer write clock period is used, the memory cell is less likely to function improperly when a write operation overlaps a read operation.

However, the use of an enlarged write clock cycle slows circuit operation. Moreover, larger write clock cycles will not always ensure proper operation of a memory cell, particularly when the memory cell exhibits large variations due to changes in process, voltage, and temperature (so-called PVT variations). As device sizes and operating voltages become smaller with successive generations of semiconductor manufacturing technology, PVT variations become increasingly important and are expected to be responsible for a growing portion of memory array operational failures such as the disruptions that arise during concurrent read and write operations.

It would therefore be desirable to be able to avoid the deleterious effects of concurrent write and read operations in a dual port memory array without using enlarged write clock cycles.

SUMMARY

In accordance with the present invention, dual port memory array circuitry is provided that has bit line voltage clamping circuitry. The dual port memory array circuitry may be used on an integrated circuit such as an application specific integrated circuit, a memory chip, or a programmable integrated circuit.

The dual port memory array circuitry has a dual port memory array formed of rows and columns of dual port memory cells. Each memory cell is formed from a pair of cross-coupled inverters. Two pairs of address transistors are associated with each memory cell. One pair of address transistors is used by one port and the other pair of address transistors is used by the other port.

The dual port memory array supports simultaneous read and write operations. For example, a write operation can be performed on one port while a read operation is being performed on the other port.

Bit lines and word lines are associated with the rows and columns of the dual port memory array. During read operations, a word line is asserted and data is read from cells in an associated column using sense amplifiers. The read operation tends to pull the bit line voltages low. Because of the presence of the bit line voltage clamping circuitry, the minimum voltage to which a read line can be pulled is limited (e.g., to within 10-32% of a positive power supply voltage). During write operations, word lines are asserted and appropriate write drivers are used to drive write signals onto bit lines in the array. When a write operation is performed during a read operation, the write drivers must overcome the loads produced by the bit line capacitances and pulled-down voltages on the read bit lines. Because the voltage clamping circuitry prevents the bit line voltages on the read port from being pulled too low, write-during-read operations are successful, even if the memory cell being written to has been adversely affected by variations due to process, voltage, and temperature.

Further features of the invention, its nature and various advantages will be more apparent from the accompanying drawings and the following detailed description of the preferred embodiments.

DETAILED DESCRIPTION

The present invention relates to dual port memories. The dual port memory circuitry of the present invention may be used in any suitable integrated circuit. For example, the dual port memory circuitry may be used in an integrated circuit memory device or an application specific integrated circuit (ASIC). The dual port memory circuitry may also be used in a programmable logic device integrated circuit or a programmable integrated circuit of a type that is not traditionally referred to as a programmable logic device such as a digital signal processor containing programmable logic or a custom integrated circuit containing regions of programmable logic. The present invention will generally be described in the context of programmable logic device integrated circuits as an example.

Figure 1:
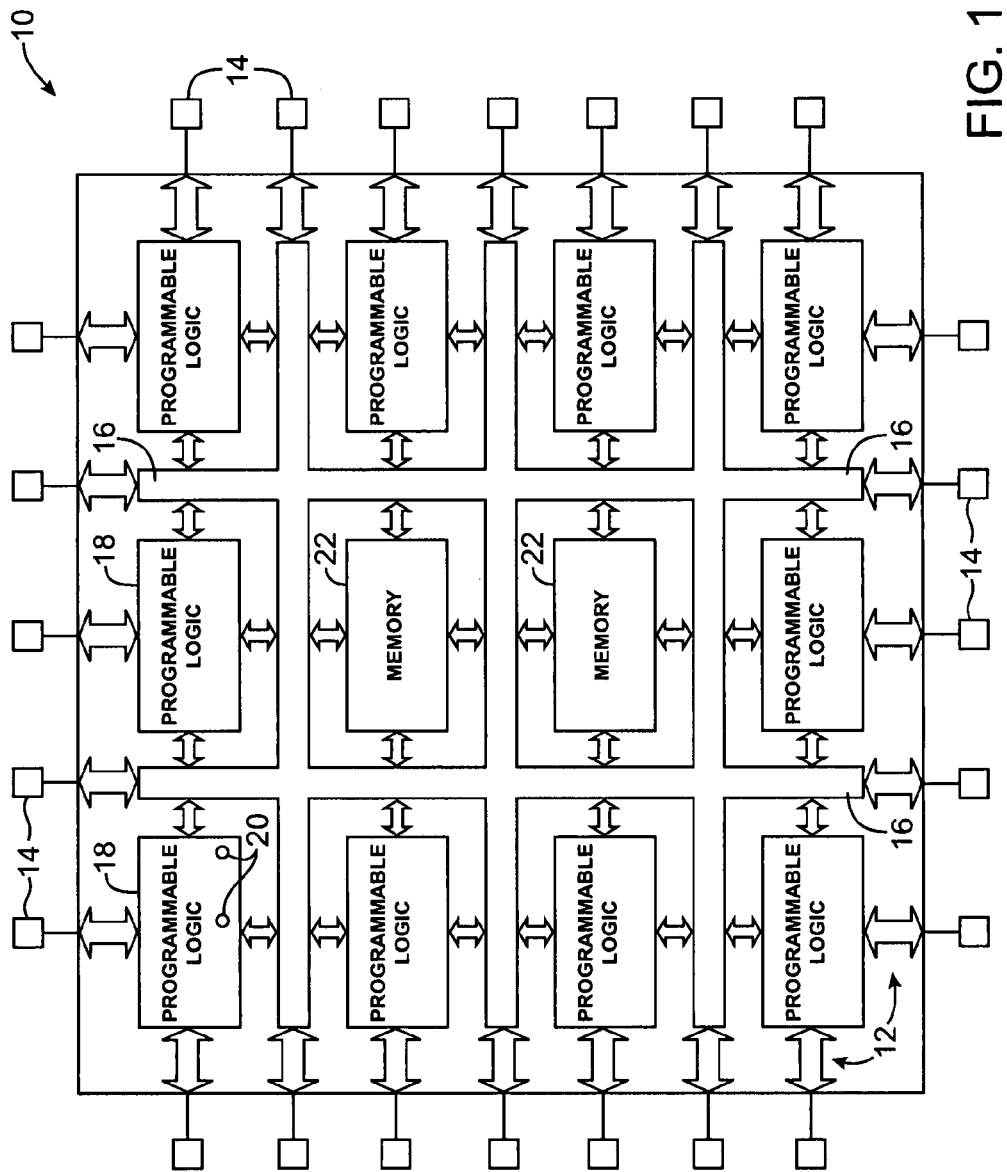
FIG. 1 is a diagram of an illustrative programmable logic device integrated circuit in accordance with the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory arrays 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory.

Memory arrays 22 contain volatile memory elements such as random-access-memory (RAM) cells. The memory arrays 22 are used to store data signals during normal operation of device 10. The memory arrays 22 need not all be the same size. For example, small, medium, and large memory arrays 22 may be included on the same programmable logic device. There may, for example, be hundreds of small memory arrays each having a capacity of about 512 bits, two to nine large memory arrays each having a capacity of about half of a megabit, and an intermediate number of medium size memory arrays each having a capacity of about 4 kilobits to 8 kilobits. These are merely illustrative memory block sizes and quantities. In general, there may be any suitable size and number of memory arrays 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Memory 22 preferably includes at least some dual port memory. A dual port memory array 22 has two independent ports for writing and reading data. In a typical scenario, user logic that is implemented from a portion of programmable logic 18 generates data. The data is stored in a dual port memory array 22. Data is stored by writing the data into memory cells at a particular address within the memory array. The stored data can be accessed by performing a read operation. Because the memory array has two ports, one port may be used to perform read or write operations at the same time that the other port is being used to perform read or write operations. Separate clocks may be used for each port.

Figure 2:
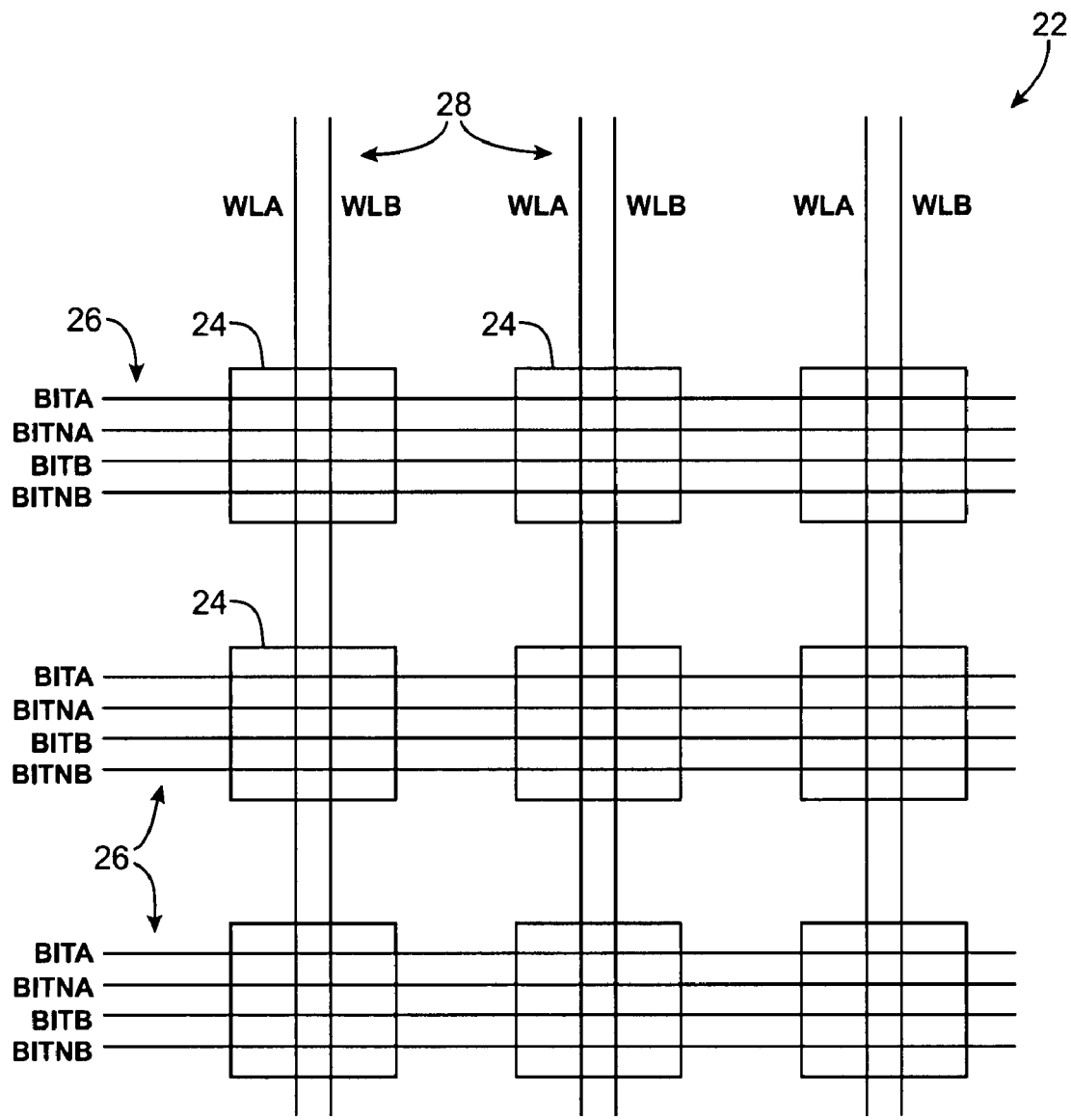
FIG. 2 is a diagram of an illustrative dual port memory array in accordance with the present invention.

An illustrative dual port memory array 22 is shown in FIG. 2. Array 22 has a number of memory cells 24 in which data can be stored and from which data can be retrieved. The illustrative memory array 22 of FIG. 2 has three rows and three columns of memory cells. In an actual integrated circuit, memory array 22 is typically larger. For example, an 8K memory array may have 256 columns and 32 rows of memory cells 24.

Array 22 has bit lines 26 and word lines 28. Bit lines 26 and word lines 28 are used to select which cells 24 are accessed. For example, if a particular word line 28 is asserted during a read operation, the data stored in the cells 24 that are connected to that word line will pass their stored data onto the bit lines 26. During a write operation, data that is to be written into array 22 is placed on bit lines 26 while an appropriate word line 28 is asserted.

Because the array 22 has two ports, there are two word lines 28 associated with each column of memory cells 24. The first word line in each column of cells 24 in FIG. 2 is labeled WLA to indicate that it is associated with a first port ("port A"). The second word line in each column of cells 24 in FIG. 2 is labeled WLB to indicate that it is associated with a second port ("port B"). Control circuitry asserts the word lines in each column individually.

Memory array 22 may use a differential bit line arrangement or a single bit line arrangement. In a single bit line arrangement, each row of the memory array 22 has two associated bit lines, one of which is used for the first port (port A) and the other of which is used for the second port (port B). The illustrative arrangement shown in FIG. 2 uses a differential bit line arrangement. In a differential bit line arrangement, each row of the memory array has four associated bit lines. One differential pair of bit lines in each row is associated with the first port and the other differential pair of bit lines in each row is associated with the second port. As shown in FIG. 2, the pair of bit lines labeled BITA and BITNA in each row are associated with the first port (port A), whereas the pair of bit lines labeled BITB and BITNB in each row are associated with the second port.

Figure 3:
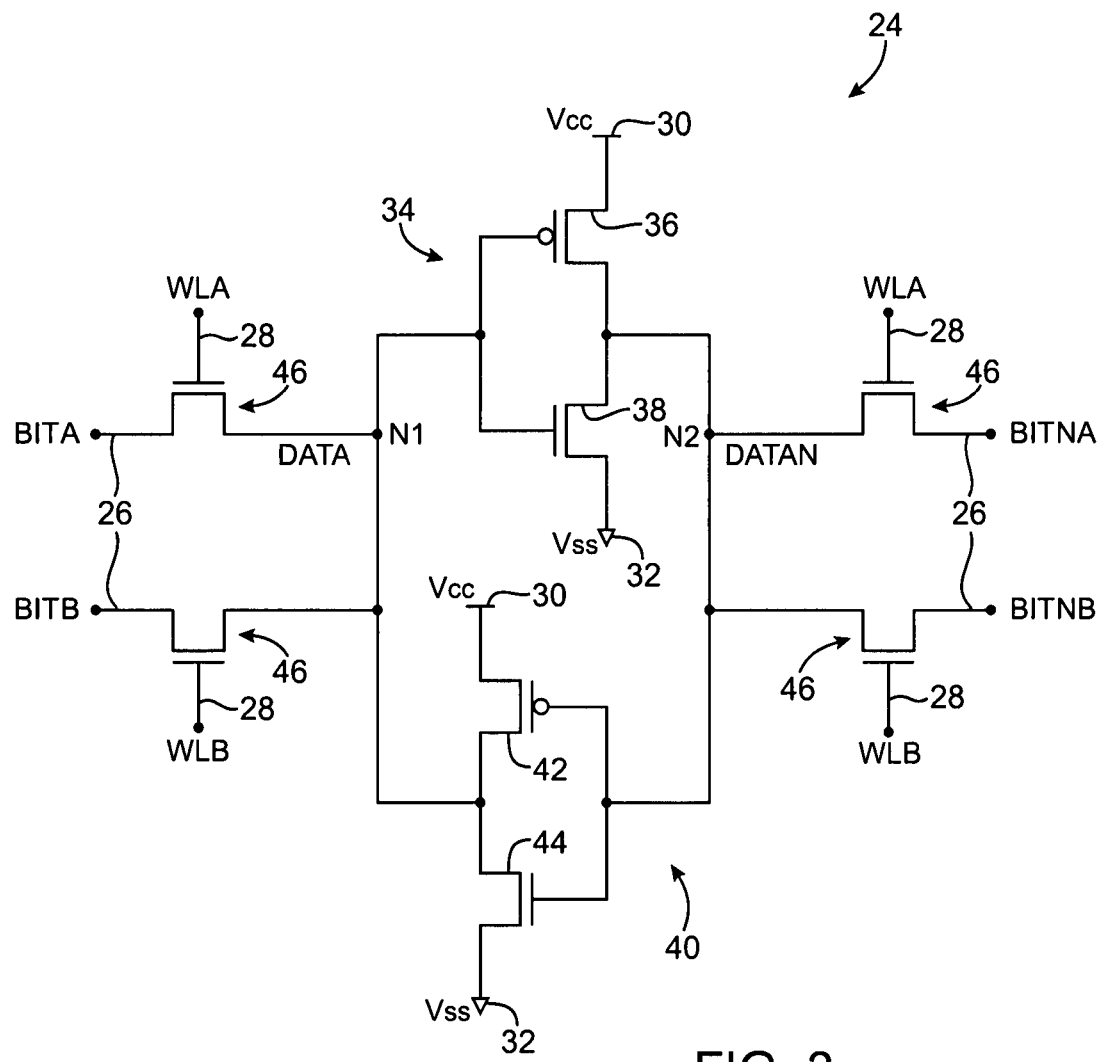
FIG. 3 is a diagram of an illustrative memory cell in a dual port memory array in accordance with the present invention.

An illustrative memory cell 24 is shown in FIG. 3. Memory cell 24 has two cross-coupled inverters 34 and 40. Inverter 34 has p-channel metal-oxide-semiconductor (PMOS) transistor 36 and n-channel metal-oxide-semiconductor (NMOS) transistor 38. Inverter 40 has PMOS transistor 42 and NMOS transistor 44. The inverters 34 and 40 are powered with a positive power supply voltage Vcc supplied to terminals 30 (power supply source 30) and a ground power supply voltage Vss supplied to terminals 32. In a typical integrated circuit, Vcc may be 1.1 volts and Vss may be 0 volts. In general, any suitable values of Vcc and Vss may be used.

Memory cell 24 has four associated bit lines 26. During read operations through port A, data is read out of memory cell 24 over bit lines BITA and BITNA and is sensed using associated differential sense amplifier circuitry. During write operations through port A, data on bit lines BITA and BITNA is loaded into memory cell 24. Similarly, data is read out of memory cell 24 over bit lines BITB and BITNB during read operations through port B. During write operations through port B, data on bit lines BITB and BITNB is loaded into memory cell 24.

Memory cell 24 has four address transistors 46. One pair of address transistors 46 is controlled by the word line for port A (WLA) and is associated with port A. The other pair of address transistors 46 is controlled by the word line for port B (WLB) and is associated with port B. When WLA is asserted, the gates of the port A address transistors go high and the port A address transistors are turned on. With the port A transistors turned on, the bit lines BITA and BITNA are connected to nodes N1 and N2, respectively. When WLB is asserted, the gates of the port B address transistors go high and the port B address transistors are turned on. With the port B address transistors turned on, the bit lines BITB and BITNB are connected to nodes N1 and N2, respectively.

As shown in FIG. 3, the signal on node N1 is labeled "DATA" and represents the contents of memory cell 24, whereas the signal on node N2 is labeled "DATAN" and represents the inverse of the signal DATA. When a logic one is stored in cell 24, node N1 is high (e.g., Vcc) and node N2 is low (e.g., Vss). When a logic zero is stored in cell 24, node N1 is low (e.g., Vss) and node N2 is high (e.g., Vcc).

During a read operation, the two address transistors associated with a given port are turned on, so that the contents of the cell may be sensed over a differential bit line pair 26. For example, during a read operation on port A, word line signal WLA is asserted, which turns on the port A address transistors, so that signals DATA and DATAN are conveyed to a differential sense amplifier over bit lines BITA and BITNA, respectively.

During a write operation, the two address transistors associated with a given port are also turned on using a word line. For example, during a write operation on port B, word line signal WLB is asserted, which turns on the port B address transistors. The data that is to be loaded into cell 24 is provided by a bit line driver over differential bit lines BITB and BITNB. When the bit lines BITB and BITNB are connected to nodes N1 and N2 by turning on the port B address transistors, the data on lines BITB and BITNB is driven into the memory cell 24. For example, if a logic one is being loaded into cell 24, node N1 will be driven high (e.g., Vcc) by a high signal on bit line BITB while node N2 is being driven low (e.g., Vss) by a low signal on complementary bit line BITNB.

It is often desired to operate the two ports of a dual port memory array asynchronously. In this type of situation, each port uses an independent clock. For example, a dual port memory array that is used as a clock conversion FIFO circuit uses a first clock (CLKA) for port A and uses a second clock (CLKB) for port B. Because there is no fixed rate and phase relationship between CLKA and CLKB, overlaps sometimes result between read and write events. In conventional dual port memory arrays, overlaps can lead to performance degradations and, in worse-case scenarios, can prevent an operation from being performed successfully.

As an example, consider a conventional dual port memory cell in which a write operation is initiated on port B during a read operation on port A. During the read operation on port A, a word line such as word line WLA of FIG. 3 is asserted, which turns on the port A address transistors. Turning on the port A address transistors connects the port A bit lines to nodes such as nodes N1 and N2 in FIG. 3. Loading effects due to the presence of these bit lines make it difficult or impossible for the desired data to be written into the cell when the word line WLB on port B is asserted.

Figure 4:
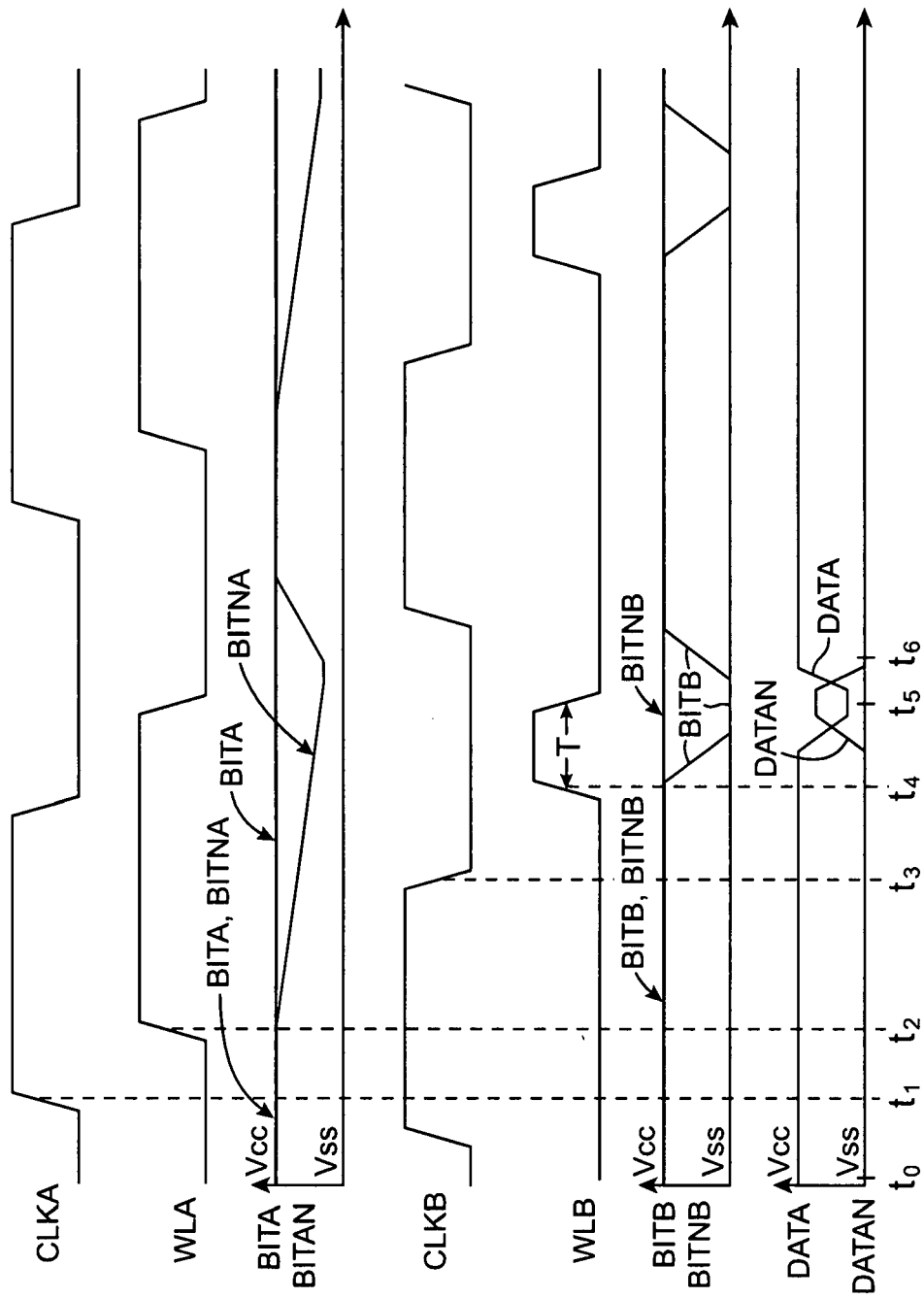
FIG. 4 is a timing diagram showing how a write operation in a conventional dual port memory array memory cell can fail when the write operation is initiated during a read operation.

A timing diagram that illustrates this worse-case write-during-read scenario for a conventional memory cell is shown in FIG. 4. In the example of FIG. 4, a write operation is performed on port B while a read operation is being performed on port A. The signals CLKA and CLKB in FIG. 4 are the clock signals respectively associated with a first port (port A) and second port (port B). The clocks CLKA and CLKB are independent from each other and therefore can have different rates and phases.

In the example of FIG. 4, the memory cell contains a logic one and an attempt is being made to write a logic zero into the cell. As shown in FIG. 4, at time $t_0$, the signal DATA on node N1 is high at Vcc (i.e., a logic one) and the signal DATAN on node N2 is low at Vss. The bit lines BITA, BITNA, BITB, and BITNB are precharged to Vcc.

At time $t_1$, the clock signal CLKA, which serves as a read clock for port A, goes high. After a short delay due to address decoding and word line driver delays, the word line WLA goes high (time $t_2$). This initiates the read operation for the cell. Both of the port A address transistors are turned on, so that the sense amplifier associated with the port A bit lines can sense the signals on nodes N1 and N2. Because node N1 is at Vcc, the state of bit line BITA remains high at time $t_2$. Node N2 is at Vss. When its associated address transistor is turned on at time $t_2$, the low voltage on node N2 pulls down the voltage on bit line BITNA from Vcc towards Vss. As shown in the third trace of FIG. 4, the signal BITNA may be pulled down from a high Vcc value of 1.1 volts to a low value of about 300 mV. (Most cells in the memory array typically exhibit less of a voltage drop during read operations, but due to PVT variations, at least some cells are pulled down to 300 mV.) The sense amplifier connected to the port A bit lines senses the decrease in the BITNA signal and concludes that the memory cell contains a logic one.

At time $t_3$, the clock signal CLKB, which serves as a write clock for port B, goes low. Data write operations are triggered by the falling edge of the write clock, so that in situations in which a single clock is used (i.e., when CLKB equals CLKA), the write word line WLB will go high after the read operation is complete and the read word line WLA is low. This ensures that in a single-clock environment, a read will be executed before a write when both a read and write command are issued simultaneously.

After a short delay associated with address decoding and word line driver delays on port B, the write word line signal WLB goes high (time $t_4$). The write word line pulse defined by WLB is generally much shorter than the read word line pulse defined by WLA. In the example of FIG. 4, the write word line pulse starts while the read word line pulse is still active.

When signal WLB goes high at the beginning of the write word line pulse, the port B address transistors are turned on and the port B write drivers attempt to drive a logic zero into the memory cell. As shown in the second-to-last trace of FIG. 4, the write drivers for port B attempt to drive a logic zero into the memory cell by taking the bit line signal BITNB to Vcc and the bit line signal BITB to Vss.

There is a non-negligible capacitance associated with the bit lines such as the BITA and BITNA bit lines. When the port A address transistors are on (as is the situation during a read operation), this capacitance is connected to the nodes N1 and N2 and serves as a undesirable load on nodes N1 and N2. For example, when the address transistor associated with bit line BITNA is turned on, the bit line BITNA becomes electrically connected to node N2.

The presence of capacitive loading from the port A bit lines that are connected to nodes N1 and N2 during a read operation makes it difficult for conventional memory cells circuits to switch properly when the write word line is asserted. As shown in the last trace of FIG. 4, the DATA signal on node N1 is initially high (e.g., at times $t_0$, $t_1$, $t_2$, and $t_3$). At time $t_4$, the write driver circuitry in port B takes signal BITB low while BITNB is held high, in an attempt to take node N1 to a logic low and N2 to a logic high. Because of the loading imposed by the presence of bit lines BITA and BITNA, however, the signals DATA and DATAN do not change rapidly enough to attain their desired values before the end of the write pulse at time $t_6$.

As shown in FIG. 4, even though a high signal BITNB is driven onto the write bit line connected to node N2 at time $t_4$, this high signal is not able to rapidly overcome the low voltage (e.g., the 300 mV voltage) to which node N2 has been pulled due to the read operation. As a result, signal DATA does not fall low enough at time $t_5$ to serve as a logic zero and signal DATAN does not rise high enough at time $t_5$ to serve as a logic one. The write operation is therefore unable to flip the state of the memory cell so that a logic zero is stored instead of a logic one. The attempt at writing the logic zero into the memory cell using the conventional arrangement of FIG. 4 does not succeed, because it is too difficult for the write drivers to overcome the low voltage pull-down on node N2 due to the concurrent read operation.

Figure 5:
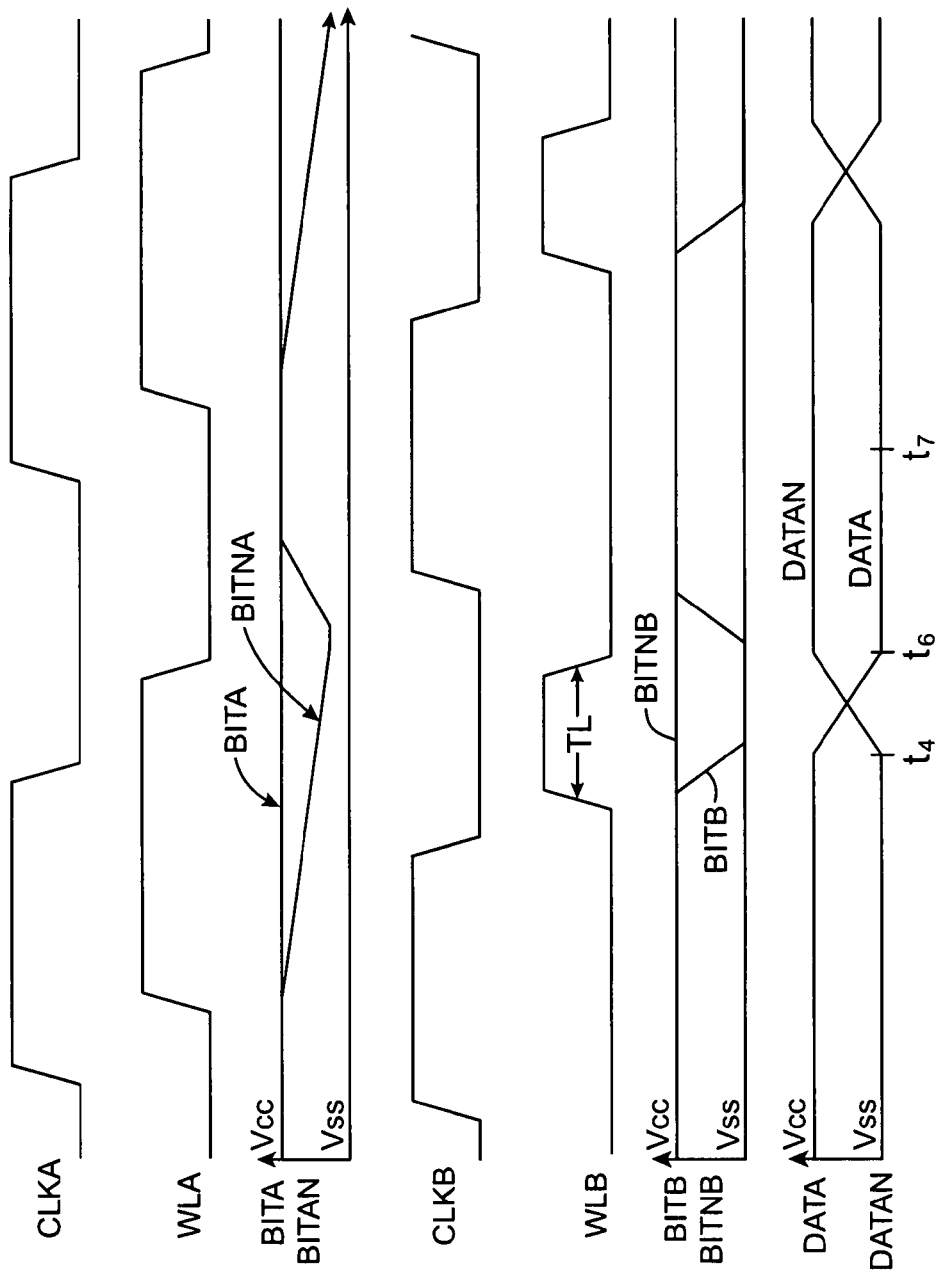
FIG. 5 is a timing diagram showing how a write operation in a conventional dual port memory array memory cell may sometimes succeed when the write operation is initiated during a read operation, provided that the write clock cycle is enlarged.

A conventional technique for improving write performance during read operations involves lengthening the amount of time that the write word lines is asserted. When the write pulse length is enlarged sufficiently, there is enough time for the signals DATA and DATAN to switch to their desired values. This conventional approach for ensuring proper write-during-read performance is shown in FIG. 5. As shown in FIG. 5, the length TL of the write pulse of FIG. 5 is larger than the length of the write pulse T in FIG. 4. For example, TL may be about 900 ps, whereas T may be about 600 ps. This allows the signal DATA to change from a logic high at time $t_4$ to a logic low at time $t_6$ and allows the signal DATAN to change from a logic low at time $t_4$ to a logic high at time $t_6$. At time $t_7$, the zero has been successfully written into the memory cell and DATA is at Vss.

Although it may be possible to ensure successful write-during-read operations using a lengthened write pulse as shown in FIG. 5, the use of lengthened write pulses slows the operation of the memory array. Moreover, it has been determined that variations in process, voltage, and temperature (so-called PVT variations) sometimes result in memory cells that do not function properly when a write is performed during a read, even when lengthened write pulses are used.

In accordance with the present invention, successful write-during-read operations are ensured by using clamping circuitry to limit the voltage pull-down effect on the bit lines during read operations. The clamping circuitry may, as an example, prevent read bit line voltages from dropping below about 25-32% of their high values during a read (e.g., to about 0.75 volts from 1.1 volts), rather than dropping to extremely low levels such as the 300 mV level described in connection with the conventional arrangement of FIG. 4. Because the read port bit line voltages and internal nodes of the memory cells fall to only moderately low voltages, the write bit line drivers can successfully overcome these voltages when needed during a concurrent write operation.

Figure 6:
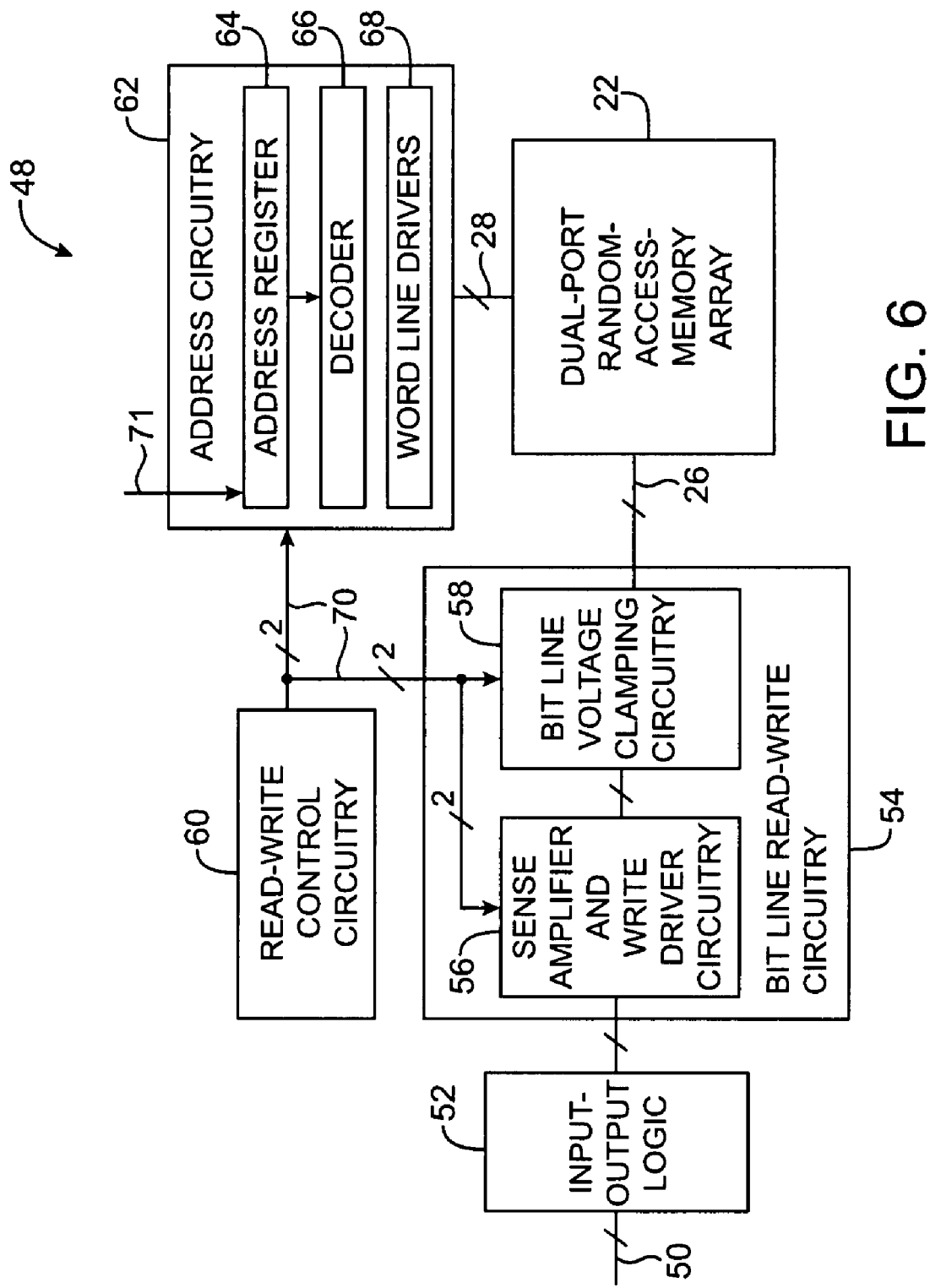
FIG. 6 is a diagram of an illustrative dual port memory circuit with bit line voltage clamping circuitry in accordance with the present invention.

A dual port memory array circuit with bit line voltage clamping circuitry in accordance with the present invention is shown in FIG. 6. As shown in FIG. 6, dual port memory array circuit 48 has a dual port random-access-memory array 22 formed from rows and columns of dual port memory cells 24 of the type described in connection with FIG. 3. Word lines 28 and bit lines 26 are used to access array 22.

During read operations, data is read from array 22 and is passed to input-output logic 52 via bit line read-write circuitry 54. Bit line read-write circuitry 54 contains sense amplifier and write driver circuitry 56. Differential sense amplifiers in bit line read-write circuitry 54 receives differential bit line signals from array 22 over respective pairs of bit lines 26. The outputs of the sense amplifiers are high or low digital signals that are provided to input-output logic 52. Sense amplifiers are typically responsive to voltage differentials on there inputs that are about 10% of Vcc. If a voltage difference greater than this amount develops across a pair of bit lines 26, the output of the sense amplifier will be either a valid high or low logic signal, depending on the polarity of the bit line signals.

Path 50 is used to pass the data that has been read from the array 22 to circuitry on the integrated circuit in which circuitry 48 is being used. For example, in a programmable logic device integrated circuit 10 of the type described in connection with FIG. 1, input-output logic 52 and path 50 are used to convey data that has been read from the array 22 to user-programmed programmable logic 18 and/or hardwired logic on the programmable logic device.

During write operations, data from user logic or other suitable circuitry is provided to input-output logic 52 over path 50. Input-output logic 52 passes the data to bit line read-write circuitry 54. Sense amplifier and write driver circuitry 56 contains write drivers that drive appropriate data signals into the array 22 over pairs of bit lines.

Dual port memory array circuit 48 has read-write control circuitry 60. Read-write control circuitry 60 generates a pair of read-write enable signals RWENA and RWENB. The read-write enable signals RWENA and RWENB are provided to bit line read-write circuitry 54 and address circuitry 62 over paths 70. The read-write enable signal RWENA is used to enable reading and writing on port A. The read-write enable signal RWENB is used to enable reading and writing on port B. With one suitable arrangement, the read-write enable signals are taken high when it is desired to enable writing and are taken low during read operations. As an example, when it is desired to write data into array 22 using port B while reading data from array 22 using port A, RWENA is a logic low (e.g., Vss) and RWENA is a logic high (e.g., Vcc).

Address circuitry 62 is used to control word lines 28. Address circuitry 62 has an address register 64, decoder 66, and word line drivers 68. Address register 64 is provided with address signals over path 71 (e.g., from user logic or other suitable circuitry on the integrated circuit in which dual port memory array circuit 48 is contained. The address signals that are provided to address register 64 are binary-encoded signals that define word line locations in array 22. The binary-encoded address signals in register 64 are decoded by decoder 66 so that individual columns of cells in array 22 may be addressed. Word line drivers 68 receive decoded address signals from decoder 66 and take associated word lines 28 high. As described in connection with FIGS. 2 and 3, each column of array 22 has two associated word lines, WLA and WLB, so there are typically twice as many word line drivers 68 for array 22 as there are columns of cells in array 22. For example, if array 22 contains 256 columns of memory cells 24, there are 512 word line drivers 68 in address circuitry 62.

Bit line voltage clamping circuitry 58 prevents the voltages on bit lines 26 from becoming too low during read operations. Because the minimum bit line voltages that can be produced during a read operation are limited, the write drivers in sense amplifier and write driver circuitry 56 are able to overcome the low memory cell voltages and bit line capacitances that are present when a write operation is performed during a read operation. The use of clamping circuitry 58 avoids the need for increasing the length of the write pulses, which allows dual port memory array circuit 48 to operate more rapidly than would be possible using a conventional lengthened write pulse arrangement of the type described in connection with FIG. 5. Moreover, the use of clamping circuitry 58 ensures that array 22 will function properly when write-during-read operations are performed even if the performance of the memory cells has been adversely affected by PVT variations that would otherwise result in write failures during read operations.

Figure 7:
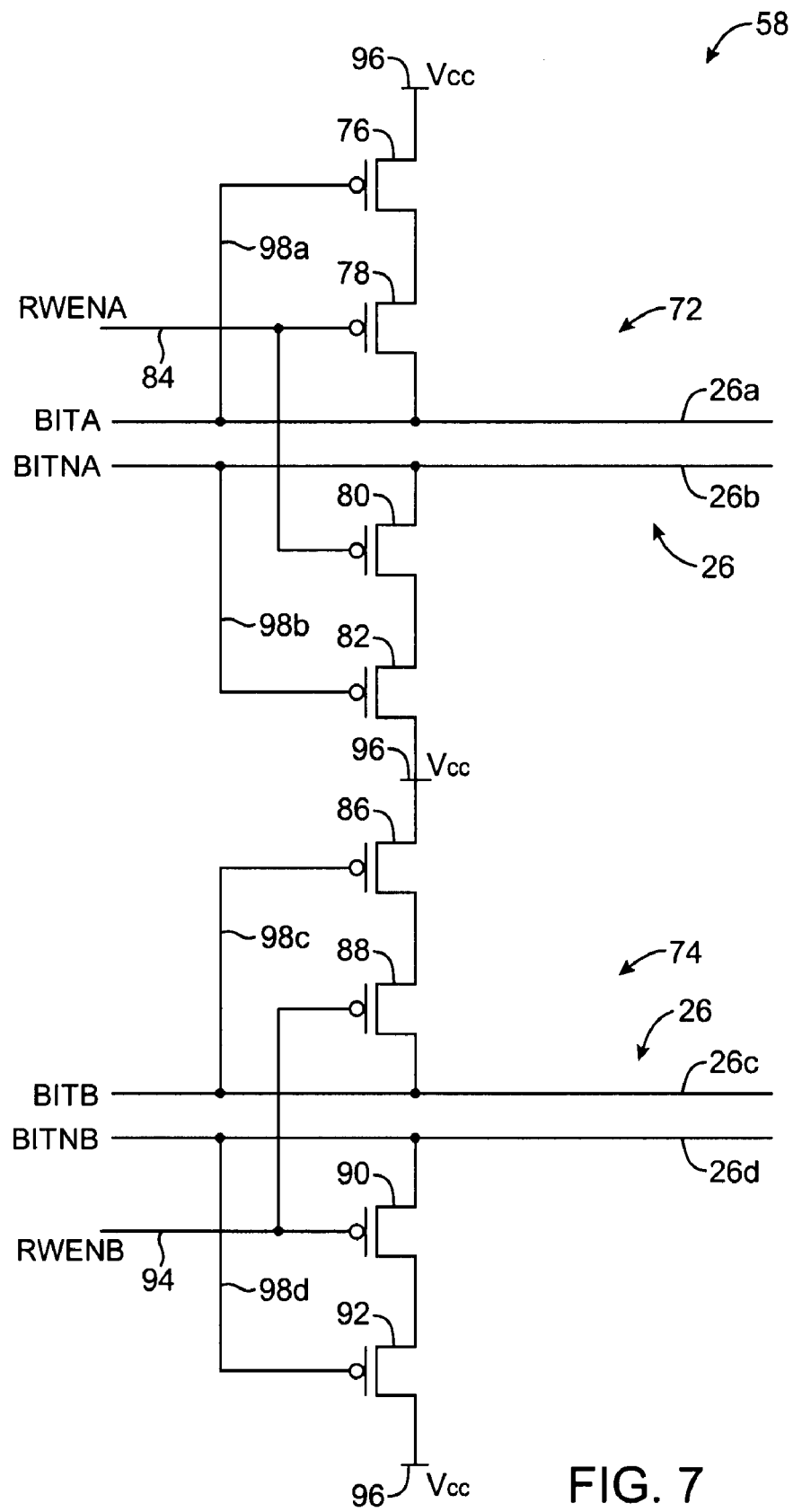
FIG. 7 is a diagram of an illustrative bit line voltage clamping circuit that may be used in a dual port memory of the type shown in FIG. 6 in accordance with the present invention.

Illustrative bit line voltage clamping circuitry 58 of the type that may be used in dual port memory array circuitry 48 is shown in FIG. 7. The clamping circuitry 58 that is shown in FIG. 7 is used to clamp bit line voltages for one of the rows of dual port random-access-memory array 22. In general there are multiple rows of memory cells in array 22, so there are multiple circuits of the type shown in FIG. 7 within the bit line voltage clamping circuitry.

As shown in FIG. 7, circuitry 58 includes a clamping circuit 72 for port A and a clamping circuit 74 for port B. Clamping circuit 72 ensures that the voltages on the port A bit lines BITA and BITNA do not fall too low during a read operation. Clamping circuit 74 ensures that the voltages on the port B bit lines BITB and BITNB do not fall too low when a read is being performed.

Clamping circuit 72 has PMOS transistors 76, 78, 80, and 82. Clamping circuit 74 has PMOS transistors 86, 88, 90, and 92. Transistors 78 and 80 in circuit 72 are controlled by the read-write enable signal RWENA on line 84. Transistors 88 and 90 in circuit 74 are controlled by the read-write enable signal RWENB on line 94. Lines 84 and 94 receive signals from the two lines in path 70 (FIG. 6). Transistors 78, 80, 88, and 90 serve as control transistors that can enable or disable the clamping functions of circuitry 58 as appropriate.

During write operations, read-write enable signals on lines 84 and 94 are high, which turns off control transistors 78, 80, 88, and 90 and disables the clamping circuits 72 and 74. During read operations, the read-write enable signals are low, which turns on control transistors 78, 80, 88, and 90 and enables the clamping circuits 72 and 74. Read-write enable signals RWENA and RWENB are generated independently by read-write control circuitry 60, so the clamping circuits on each port can be enabled and disabled independently. For example, when a write is being performed on port B while a read is being performed on port A, RWENA will be low to enable bit line voltage clamping on the port A bit lines, while RWENB will be high to disable voltage clamping on the port B bit lines.

Circuits 72 and 74 are connected to positive power supply voltage terminals 96. Each terminal 96 supplies a positive power supply voltage Vcc. The positive power supply voltage Vcc may have any suitable value. With one suitable arrangement, Vcc is 1.1 volts.

Transistors 76, 82, 86, and 92 serve as voltage regulator transistors. When clamping circuits 72 and 74 are enabled, transistors 76, 82, 86, and 92 are connected between positive power supply voltage Vcc and respective bit lines 26a, 26b, 26c, and 26d using a feedback arrangement. This ensures that the minimum voltage drop that can develop on the bits lines 26a, 26b, 26c, and 26d is limited to about Vcc-Vt, where Vt is the threshold voltage of transistors 76, 82, 86, and 92.

As shown in FIG. 7, paths 98a, 98b, 98c, and 98d connect the gates of the voltage regulator transistors 76, 82, 86, and 92 to bit lines 28 and form feedback paths. If the voltage on a given one of bit lines 26a, 26b, 26c, and 26d drops below Vcc-Vt, this low voltage is passed to the gate of the associated voltage regulator transistor via its associated feedback path 98a, 98b, 98c, or 98d. The voltage regulator transistors are PMOS devices, so when a voltage regulator transistor receives a lowered voltage on its gate, it is turned on and its source-drain resistance is lowered. A lowered voltage drop across the source and drain of the voltage regulator transistor that results from the lowered source-drain resistance pulls the bit line high to Vcc-Vt. If the bit line voltage rises above Vcc-Vt, the voltage regulator transistor turns off (e.g., to allow the bit lines to be precharged to Vcc).

Figure 8:
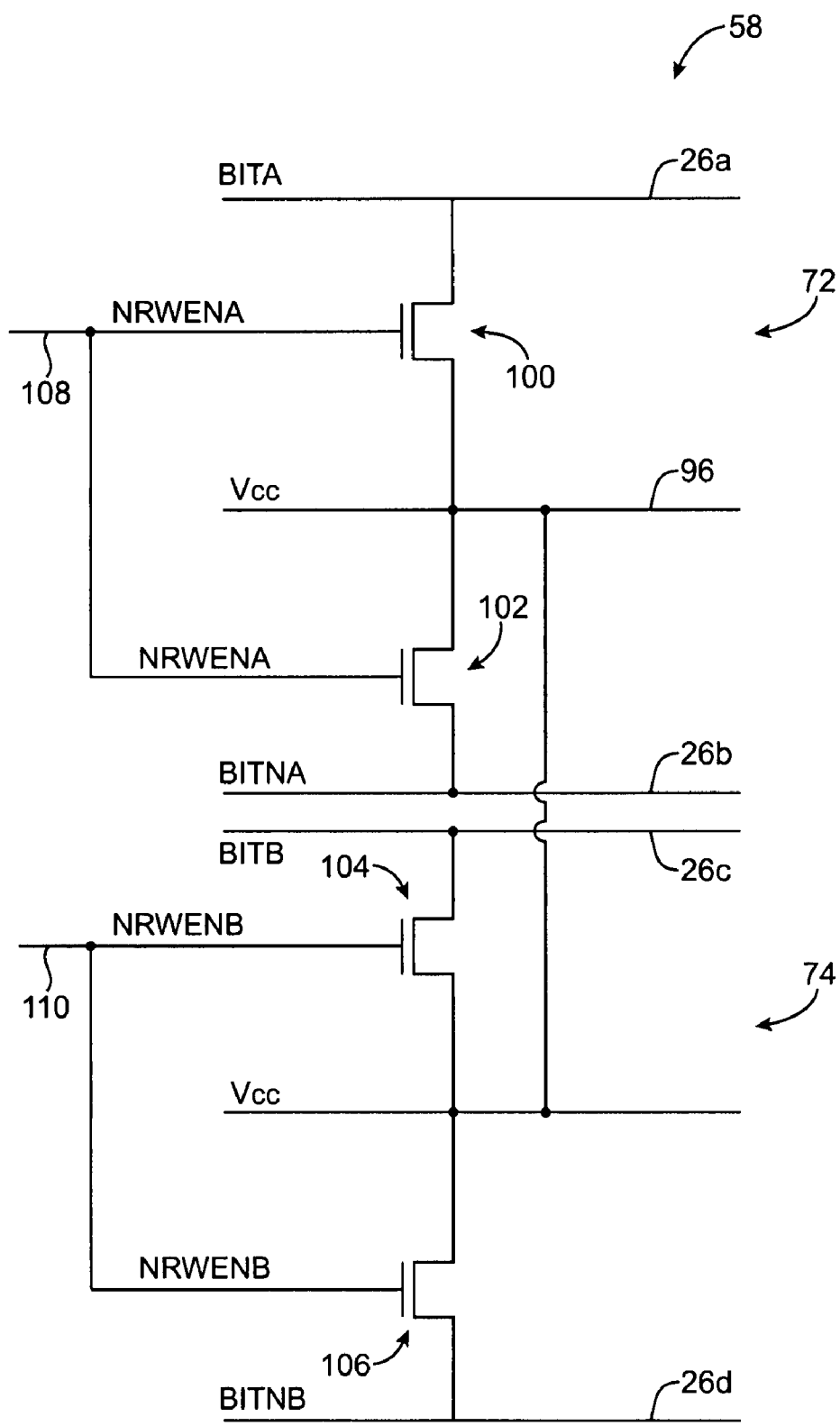
FIG. 8 is a diagram of another illustrative bit line voltage clamping circuit that may be used in a dual port memory of the type shown in FIG. 6 in accordance with the present invention.

If desired, the number of transistors that are used in implementing the bit line clamping circuitry 58 may be minimized by using a clamping circuit of the type shown in FIG. 8. As with the clamping circuitry 58 of FIG. 7, the clamping circuitry 58 that is shown in FIG. 8 is used to clamp bit line voltages for one of the rows of dual port random-access-memory array 22. Multiple circuits of the type shown in FIG. 8 are used within the bit line voltage clamping circuitry to accommodate the multiple rows of memory cells in array 22.

As shown in FIG. 8, circuitry 58 includes a clamping circuit 72 for port A and a clamping circuit 74 for port B. Clamping circuit 72 ensures that the voltages on the port A bit lines BITA and BITNA do not fall too low during a read operation. Clamping circuit 74 ensures that the voltages on the port B bit lines BITB and BITNB do not fall too low when a read is being performed.

Clamping circuit 72 has NMOS transistors 100 and 102. Clamping circuit 74 has NMOS transistors 104 and 106. Transistors 100 and 102 in circuit 72 are controlled by the complement of read-write enable signal RWENA (called NRWENA) on line 108. Transistors 104 and 106 in circuit 74 are controlled by complementary read-write enable signal NRWENB on line 110. Lines 108 and 110 receive these control signals from the two lines in path 70 (FIG. 6). Transistors 100, 102, 104, and 106 are activated when it is desired to electrically connect bit lines 26a, 26b, 26c, and 26d to positive power supply voltage source (terminal) 96 during clamping operations. Source 96 supplies a positive power supply voltage Vcc. The positive power supply voltage Vcc may have any suitable value. With one suitable arrangement, Vcc is 1.1 volts.

During write operations, the complementary read-write enable control signals on lines 108 and 110 are low, which turns off transistors 100, 102, 104, and 106 and deactivates clamping. During read operations, the complementary read-write enable control signals are high, which activates transistors 100, 102, 104, and 106 and enables clamping by circuits 72 and 74. Complementary read-write enable control signals NRWENA and NRWENB are generated independently by read-write control circuitry 60, so the clamping circuits on each port can be enabled and disabled independently. For example, when a write is being performed on port B while a read is being performed on port A, NRWENA will be high and NRWENB will be low. This activates transistors 100 and 102 and connects bit lines 26a and 26b to Vcc to clamp the voltage on the port A bit lines, while voltage clamping operations are disabled on the port B bit lines 26c and 26d.

During clamping, the gates of transistors 100 and 102 are held high (in this example). If the voltage on bit lines 26a or 26b were to fall sufficiently to turn transistors 100 and 102 on, the voltage on the bit lines would be pulled high by source 96. Transistors 100 and 102 (and transistors 104 and 106) have an associated threshold voltage Vt. If a clamped bit line voltage starts to drop below Vcc-Vt, the transistor gate-source voltage Vgs will start to exceed Vt, which will turn the appropriate transistor 100 or 102 on and pull the bit line voltage back towards Vcc. Accordingly, once enabled by appropriate control signals on lines 108 and 110, the transistors 100, 102, 104, and 106 serve as clamping transistors that prevent the voltage on the bit lines from dropping too low. This ensures that write operations that occur during read operations will be successful.

Dual-port random-access memory arrays such as array 22 of FIG. 6 often include bit line multiplexing circuitry. In this type of memory array, groups of memory cells (e.g., several rows of memory cells in array 22) share a single sense amplifier 56. The bit line multiplexing circuitry is controlled by control signals from read-write control circuitry 60. The control signals are used to select which of the memory cells in the group of memory cells associated with a given sense amplifier is actively connected to the sense amplifier during a read operation. In a typical scenario, array 22 is organized such that two, four, or eight rows of memory cells are grouped together. The bit line multiplexing circuitry is used to select which of these rows of memory cells is connected to the sense amplifier. (The asserted word line in the array selects which of the memory cells in the line is addressed.)

The memory cell that is actively connected to the sense amplifier through the bit line multiplexing circuitry is exposed to the capacitance of the sense amplifier. This memory cell is said to be experiencing a "normal read." Other memory cells are not actively connected to the sense amplifier because they are isolated by the bit line multiplexing circuitry. These inactive memory cells are not exposed to the capacitance of the sense amplifier. Memory cells in this condition are said to be experiencing a "phantom read."

The cells involved in a phantom read operation experience less loading than the cells involved in normal read operations, so these cells are generally able to pull their associated bit lines to lower voltages than the cells involved in normal reads. As a result, cells involved in phantom read operations are more likely to experience write failures during read operations than cells involved in normal read operations. By using clamping circuitry such as the clamping circuitry described in connection with FIGS. 7 and 8, the bit lines involved in both normal read operations and phantom read operations are successfully clamped, thereby ensuring that write during read operations will be successful.

Figure 9:
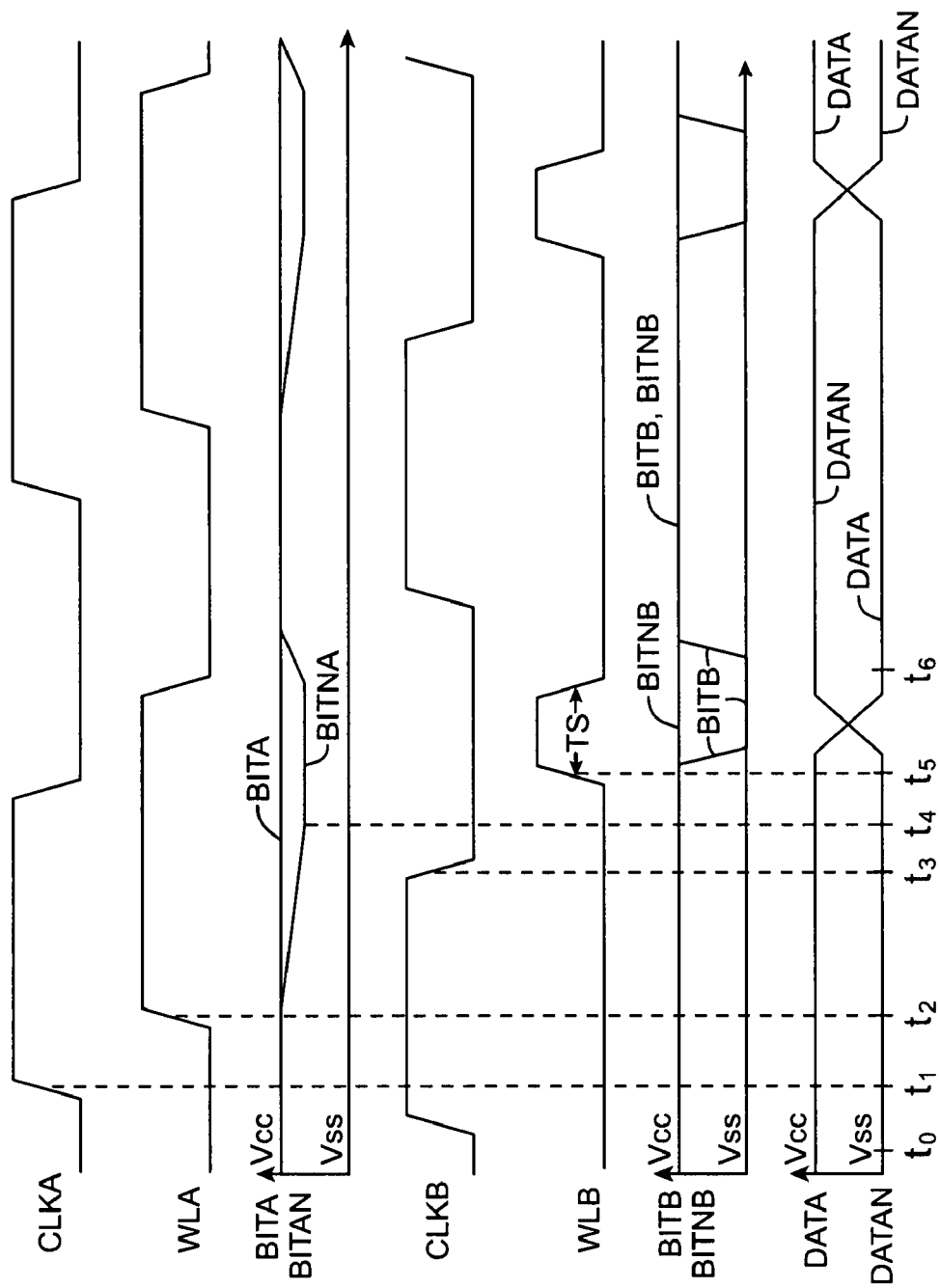
FIG. 9 is a timing diagram showing how a write operation in a memory cell in a dual port memory array with bit line clamping circuitry is successful even when the write operation is initiated during a read operation in accordance with the present invention.

The impact of the clamping circuitry 58 on the operation of a dual port memory array circuit 48 when performing write-during-read operations is shown in FIG. 9. In the example of FIG. 9, a write operation is performed on port B while a read operation is being performed on port A. The signals CLKA and CLKB in FIG. 9 are the clock signals respectively associated with port A and port B. The clocks CLKA and CLKB are independent from each other and can have different rates and phases.

In the scenario depicted in FIG. 9, the memory cell contains a logic one and a logic zero is being written into the cell. At time $t_0$, the signal DATA on node N1 is high at Vcc (i.e., a logic one) and the signal DATAN on node N2 is low at Vss. The bit lines BITA, BITNA, BITB, and BITNB are precharged to Vcc by the sense amplifier and write driver circuitry 56 (FIG. 6). Prior to time $t_1$, the read-write control circuitry 60 (FIG. 6) holds the read-write enable signal for port A (RWENA) low, to prepare the address circuitry 62 (FIG. 6) and bit line read-write circuitry 54 (FIG. 6) for a read operation on port A.

At time $t_1$, the read clock signal CLKA goes high. The word line WLA goes high at time $t_2$ after a short delay due to address decoding and word line driver delays. This initiates the read operation for the cell and turns on both of the port A address transistors. The sense amplifier associated with the port A bit lines can therefore sense the signals on nodes N1 and N2. Because node N1 is at Vcc, the state of bit line BITA remains high at time $t_2$. Node N2 is at Vss. When its associated address transistor is turned on at time $t_2$, the low voltage on node N2 pulls down the voltage on bit line BITNA from Vcc towards Vss. As shown in the third trace of FIG. 9, the signal BITNA may be pulled down from a high Vcc value of 1.1 volts to a low value of about 0.75 V at time $t_4$.

When the clamping circuit of FIG. 7 is used, control transistor 80 of the bit line voltage clamping circuitry 58 of FIG. 7 is turned on by the low RWENA signal, so the clamping circuit is active for bit line BITNA. When the voltage of signal BITNA reaches Vcc-Vt (e.g., 1.1 V–350 mV=0.75 V), the voltage regulator transistor 82 of bit line voltage clamping circuitry 58 of FIG. 7 turns on. This prevents the voltage of BITNA from falling any lower than 0.75 V (i.e., about 32% lower than Vcc). The 32% drop in Vcc is sufficient for the sense amplifier connected to the port A bit lines to sense, because the sense amplifier is preferably responsive to voltage drops of about 10% of Vcc. The read operation is therefore successful and the sense amplifier and write driver circuitry 56 (FIG. 6) passes the logic one data bit that has been read out from the cell to input-output logic 52 (FIG. 6.)

When the clamping circuit of FIG. 8 is used, transistor 102 of the bit line voltage clamping circuitry 58 of FIG. 8 is turned on by a high NRWENA signal, so the clamping circuit is active for bit line BITNA. When the voltage of signal BITNA reaches Vcc-Vt (e.g., 1.1 V–350 mV=0.75 V), the transistor 102 of bit line voltage clamping circuitry 58 of FIG. 8 turns on. This prevents the voltage of BITNA from falling any lower than 0.75 V (i.e., about 32% lower than Vcc). The 32% drop in Vcc is sufficient for the sense amplifier connected to the port A bit lines to sense, because the sense amplifier is preferably responsive to voltage drops of about 10% of Vcc (as in the FIG. 7 scenario). The read operation is therefore successful and the sense amplifier and write driver circuitry 56 (FIG. 6) passes the logic one data bit that has been read out from the cell to input-output logic 52 (FIG. 6.)

Prior to time $t_4$, at time $t_3$, the clock signal CLKB, which serves as a write clock for port B, goes low. Data write operations are preferably triggered by the falling edge of the write clock, so that in situations in which a single clock is used (i.e., when CLKB equals CLKA), the write word line WLB will go high after the read operation is complete and the read word line WLA is low. This ensures that the read will be executed before the write when both a read and write command are issue simultaneously in a single-clock environment.

In the example of FIG. 9, two separate clocks CLKA and CLKB are used. A short time after CLKB goes low (i.e., after a short delay associated with address decoding and word line driver delays on port B), the write word line signal WLB goes high (time $t_5$). When signal WLB goes high at the beginning of the write word line pulse, the port B address transistors are turned on and the port B write drivers drive a logic zero into the memory cell. As shown in the second-to-last trace of FIG. 9, the write drivers for port B take the bit line BITB low at time $t_5$, so that a zero is driven onto node N1. The signal BITNB is held high at time $t_5$, so that a one is driven onto node N2. The voltage on bit line BITNA and therefore on node N2 is significantly higher at time $t_5$ of FIG. 9 than the voltage on bit line BITNA at time $t_4$ in the conventional arrangement shown in FIG. 4.

The higher voltage on bit line BITNA at time $t_5$ of FIG. 9, which is the result of the clamping action of bit line voltage clamping circuitry 58, represents less of a load on the write driver than the lower voltage on bit line BITNA at time $t_4$ of FIG. 4. As a result, the high signal BITNB that is driven onto the write bit line connected to node N2 at time $t_5$ is able to rapidly overcome the read bit line voltage (e.g., the 0.75 V voltage) to which node N2 has been pulled due to the read operation. Signal DATA is therefore able to switch quickly from its initial high state at time $t_5$ to a low state at time $t_6$, as shown in the last trace of FIG. 9. Signal DATAN is also able to switch quickly and rises from a logic low at $t_5$ to a logic high at time $t_6$. As shown in the second-to-last trace of FIG. 9, signal BITNB slews faster during its high-to-low and low-to-high transitions than in the conventional arrangement of FIG. 4.

The write operation is therefore successful at flipping the state of the memory cell so that a logic zero is stored instead of a logic one. In contrast, the attempt at writing the logic zero into the memory cell using the conventional arrangement of FIG. 4 did not succeed, because it was too difficult for the write drivers in the conventional arrangement to overcome the low unclamped read bit line voltage on node N2. Successful write-during-read operations of the type described in connection with FIG. 9 can be accomplished without lengthening the time TS of the write pulse as described in FIG. 5. For example, using a conventional memory cell layout, write pulses of 600 ps may be used to perform successful write-during-read operations.

The foregoing is merely illustrative of the principles of this invention and various modifications can be made by those skilled in the art without departing from the scope and spirit of the invention.

What is claimed is:

1. A dual port memory array circuit, comprising:
   a dual port memory array having memory cells that are accessed using bit lines and word lines;
   address circuitry that is connected to the dual port memory array using the word lines;
   bit line read-write circuitry that is connected to the dual port memory array using the bit lines; and
   bit line voltage clamping circuitry in the bit line read-write circuitry that limits how much signals on the bit lines drop during read operations, wherein the bit line voltage clamping circuitry comprises first transistors and second transistors, wherein each one of the first and second transistors has a source and a drain, wherein the bit line voltage clamping circuitry is connected between the bit lines and a power supply voltage source, and wherein the source and drain of one of the first transistors and the source and drain of one of the second transistors are connected in series between each of the bit lines and the power supply voltage source.

2. A dual port memory array circuit, comprising:
   a dual port memory array having memory cells that are accessed using bit lines and word lines;
   address circuitry that is connected to the dual port memory array using the word lines;
   bit line read-write circuitry that is connected to the dual port memory array using the bit lines; and
   bit line voltage clamping circuitry in the bit line read-write circuitry that limits how much signals on the bit lines drop during read operations, wherein the bit line voltage clamping circuitry comprises first transistors and second transistors, wherein the bit line voltage clamping circuitry is connected between the bit lines and a power supply voltage source, and wherein one of the first transistors and one of the second transistors are connected in series between each of the bit lines and the power supply voltage source, wherein the first transistors comprise first p-channel metal-oxide-semiconductor transistors and wherein the second transistors comprise second p-channel metal-oxide-semiconductor transistors.

3. The dual port memory array circuit defined in claim 2, wherein the second p-channel metal-oxide-semiconductor transistors each have a gate that receives a read-write enable control signal.

4. The dual port memory array circuit defined in claim 2, wherein the first p-channel metal-oxide-semiconductor transistors each have a gate that is connected to a respective one of the bit lines.

5. The dual port memory array circuit defined in claim 4 further comprising read-write control circuitry, wherein the second p-channel metal-oxide-semiconductor transistors each have a gate that receives a read-write control signal from the read-write control circuitry that is low during read operations to turn that second p-channel metal-oxide-semiconductor transistor on and that is high during write operations to turn that second p-channel metal-oxide-semiconductor transistor off.

6. Circuitry in a dual port memory array circuit, comprising:
   a dual port memory array cell having cross-coupled inverters and first and second ports for performing read and write operations on the dual-port memory array cell, wherein the first port is formed using a first pair of address transistors, a first pair of bit lines, and a first word line that controls the first pair of address transistors, and wherein the second port is formed using a second pair of address transistors, a second pair of bit lines, and a second word line that controls the second pair of address transistors; and
   bit line voltage clamping circuitry associated with each of the ports that limits how much signals on the bit lines drop during read operations, so that write operations on one of the ports are successful during read operations on the other of the ports, wherein the bit line voltage clamping circuitry comprises pairs of transistors, wherein each transistor in the pairs of transistors has a source and a drain, and wherein each given one of the pair of transistors is coupled in series between a respective one of the bit lines and a power supply voltage source through the sources and drains of the transistors in the given pair of transistors.

7. Circuitry in a dual port memory array circuit, comprising:
   a dual port memory array cell having cross-coupled inverters and first and second ports for performing read and write operations on the dual-port memory array cell, wherein the first port is formed using a first pair of address transistors, a first pair of bit lines, and a first word line that controls the first pair of address transistors, and wherein the second port is formed using a second pair of address transistors, a second pair of bit lines, and a second word line that controls the second pair of address transistors; and
   bit line voltage clamping circuitry associated with each of the ports that limits how much signals on the bit lines drop during read operations, so that write operations on one of the ports are successful during read operations on the other of the ports, wherein the bit line voltage clamping circuitry comprises pairs of transistors each of which is coupled in series between a respective one of the bit lines and a power supply voltage source, wherein the pairs of transistors in the bit line voltage clamping circuitry comprise pairs of p-channel metal-oxide-semiconductor transistors.

8. The circuitry defined in claim 7, wherein each pair of p-channel metal-oxide-semiconductor transistors comprises a first p-channel metal-oxide-semiconductor transistor having a gate connected to one of the bit lines and a second p-channel metal-oxide-semiconductor transistor having a gate that is controlled by read-write enable control signals.

9. A programmable logic device integrated circuit comprising:
   a plurality of programmable logic regions containing programmable elements that are programmed using configuration data;
   a plurality of dual-port memory arrays; and
   programmable interconnects that interconnect the programmable logic regions and the dual-port memory arrays, wherein each of the dual-port memory arrays comprises memory cells that are accessed using bit lines and word lines, has address circuitry that is connected to the dual port memory array using the word lines, has bit line read-write circuitry that is connected to the dual port memory array using the bit lines, and has bit line voltage clamping circuitry in the bit line read-write circuitry that limits how much signals on the bit lines drop during read operations.

10. The programmable logic device integrated circuit defined in claim 9 wherein the bit line voltage clamping circuitry comprises transistors that have gate terminals coupled to the bit lines.

11. The programmable logic device integrated circuit defined in claim 9 wherein each dual-port memory array comprises read-write control circuitry that produces control signals and wherein the bit line voltage clamping circuitry comprises transistors having gates that receive the control signals.

12. The programmable logic device integrated circuit defined in claim 9, wherein the bit line voltage clamping circuitry comprises pairs of transistors each of which is coupled in series between a respective one of the bit lines and a power supply voltage source.

13. The programmable logic device integrated circuit defined in claim 9, wherein the bit line voltage clamping circuitry comprises pairs of transistors each of which is coupled in series between a respective one of the bit lines and a power supply voltage source, wherein each pair of transistors comprises a first transistor having a gate connected to one of the bit lines and a second transistor having a gate that is controlled by read-write enable control signals.

* * * * *